US009150687B2

(12) United States Patent
Spreitzer et al.

(10) Patent No.: US 9,150,687 B2
(45) Date of Patent: Oct. 6, 2015

(54) ELECTRONIC DEVICES CONTAINING ORGANIC SEMI-CONDUCTORS

(75) Inventors: Hubert Spreitzer, Viernheim (DE);
Aurélie Ludemann, Frankfurt (DE);
René Scheurich, Groß-Zimmern (DE);
Niels Schulte, Kelkheim (DE); Arne Büsing, Frankfurt am Main (DE);
Philipp Stössel, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 1002 days.

(21) Appl. No.: 11/664,473

(22) PCT Filed: Sep. 20, 2005

(86) PCT No.: PCT/EP2005/010112
§ 371 (c)(1),
(2), (4) Date: Mar. 30, 2007

(87) PCT Pub. No.: WO2006/037458
PCT Pub. Date: Apr. 13, 2006

(65) Prior Publication Data
US 2008/0113468 A1    May 15, 2008

(30) Foreign Application Priority Data
Oct. 1, 2004    (EP) ..................................... 04023475

(51) Int. Cl.
*H01L 27/15*    (2006.01)
*C08G 61/12*    (2006.01)
*C08G 73/00*    (2006.01)
*H01L 51/00*    (2006.01)

(52) U.S. Cl.
CPC .............. *C08G 61/12* (2013.01); *C08G 61/126* (2013.01); *C08G 73/00* (2013.01); *H01L 51/0025* (2013.01); *H01L 51/0035* (2013.01); *H01L 51/0052* (2013.01); *H01L 51/002* (2013.01); *H01L 51/0037* (2013.01); *H01L 51/0038* (2013.01); *H01L 51/0039* (2013.01); *H01L 51/0059* (2013.01); *H01L 51/0081* (2013.01); *Y02E 10/549* (2013.01)

(58) Field of Classification Search
CPC .................. H01L 2251/5384; H01L 27/32
USPC .............. 257/40, 642, 759, E39.007, E51.01, 257/E51.012, E51.017, E51.018, E51.026, 257/E51.027, E51.046, E51.033, E21.007, 257/86; 438/99; 252/501.1
See application file for complete search history.

(56) References Cited

U.S. PATENT DOCUMENTS

| 4,239,884 | A | * | 12/1980 | Dahl .............................. 528/486 |
| 5,008,327 | A | * | 4/1991 | Shirai et al. .................... 524/544 |
| 5,247,226 | A | * | 9/1993 | Sato et al. ...................... 313/504 |
| 5,674,635 | A | * | 10/1997 | Hsieh et al. .................... 428/690 |
| 5,956,679 | A | * | 9/1999 | Komori et al. ................. 704/256 |
| 5,965,679 | A | * | 10/1999 | Godschalx et al. ............ 526/281 |
| 6,235,660 | B1 | | 5/2001 | Bhattacharjee et al. |
| 6,265,524 | B1 | * | 7/2001 | Takemoto et al. ............. 528/196 |
| 6,756,731 | B1 | * | 6/2004 | Sano .............................. 313/499 |
| 7,112,374 | B2 | * | 9/2006 | Yamazaki et al. ............. 428/690 |
| 7,547,809 | B2 | * | 6/2009 | Moriwaki et al. ............. 570/204 |
| 2002/0016392 | A1 | * | 2/2002 | Nodera .......................... 524/311 |
| 2002/0064680 | A1 | * | 5/2002 | Spreitzer et al. .............. 428/690 |
| 2003/0003300 | A1 | * | 1/2003 | Korgel et al. .................. 428/402 |
| 2003/0010973 | A1 | * | 1/2003 | Lorin et al. ...................... 257/40 |
| 2003/0034464 | A1 | * | 2/2003 | Ogawa .......................... 250/580 |
| 2003/0181745 | A1 | * | 9/2003 | Shenai-Khatkhate et al. .... 556/1 |
| 2004/0007971 | A1 | * | 1/2004 | Higashi et al. ................ 313/504 |
| 2004/0038459 | A1 | * | 2/2004 | Brown et al. .................. 438/142 |
| 2004/0109955 | A1 | * | 6/2004 | Kitano et al. .................. 428/1.1 |
| 2005/0035333 | A1 | * | 2/2005 | Gerlach ......................... 252/500 |
| 2005/0176915 | A1 | * | 8/2005 | Cho et al. ........................ 528/86 |
| 2005/0202066 | A1 | * | 9/2005 | Arata ............................. 424/443 |
| 2005/0221116 | A1 | * | 10/2005 | Cocchi et al. ................. 428/690 |
| 2005/0250930 | A1 | * | 11/2005 | Ikeda et al. .................... 528/196 |
| 2006/0058524 | A1 | * | 3/2006 | Falcou et al. .................. 544/294 |
| 2006/0124909 | A1 | * | 6/2006 | Marks et al. ................... 252/500 |
| 2007/0172698 | A1 | * | 7/2007 | Iwakuma et al. .............. 428/690 |
| 2007/0228366 | A1 | * | 10/2007 | Fukai et al. ...................... 257/40 |
| 2009/0267061 | A1 | * | 10/2009 | Marks et al. ..................... 257/40 |

FOREIGN PATENT DOCUMENTS

| GB | 2324482 A | | 10/1998 | |
| JP | 10-297910 A | | 11/1998 | |
| JP | 2000/191752 A | | 7/2000 | |
| JP | 2003/347624 A | | 12/2003 | |
| JP | 2004023081 | * | 1/2004 | ............. H01L 31/04 |
| JP | 2004165683 | * | 6/2004 | ............. H01L 33/00 |
| JP | 2004186599 | * | 7/2004 | ............. H01S 5/30 |
| JP | 2005222794 A | | 8/2005 | |
| WO | WO-98/54240 A1 | | 12/1998 | |
| WO | WO03083959 A1 | * | 10/2003 | |
| WO | WO-2004055129 A1 | | 7/2004 | |
| WO | WO-2004055921 A2 | | 7/2004 | |
| WO | WO-2004072205 A2 | | 8/2004 | |
| WO | WO2004/106403 | * | 12/2004 | |
| WO | WO-2004/106403 | | 12/2004 | |
| WO | WO2004106403 | * | 12/2004 | |
| WO | WO2005/084083 | * | 9/2005 | |

OTHER PUBLICATIONS

Abstract of WO 2004022626 A1, Falcou et al Mar. 18, 2004, 4 pages.*

(Continued)

*Primary Examiner* — Caridad Everhart
(74) *Attorney, Agent, or Firm* — Drinker Biddle & Reath LLP

(57) ABSTRACT

The present invention relates to electronic devices comprising organic semiconductors whose content of halogens is less than 20 ppm. This increases the lifetime and the efficiency of the corresponding electronic devices, and these materials are thus better suited to use in organic electronic devices than materials with a higher halogen content. The present invention further relates to corresponding organic semiconductors and to a process for their production.

14 Claims, No Drawings

(56) References Cited

OTHER PUBLICATIONS

Abstract of Nagamori et al (JP 2004-165683 A) (Jun. 10, 2004), 1 page.*
Abstract of Kawamura et al (JP 2004-023081 A) (Jan. 22, 2004), 4 pages.*
Abstract of Okada et al (JP 2004-186599 A) (Jul. 2, 2004), 4 pages.*
Kiebooms et al., "Synthesis, Electrical, and Optical Properties of Conjugated Polymers", *Handbook of Advanced Electronic and Photonic Materials and Devices*, vol. 8, Chapter 1, 90 pp. 1-102 (2001).
Brunner et al., "Carbazole Compounds as Host Materials for Triplet Emitting . . . ", JACS, 126, pp. 6035-6042 (2004).
Dijken et al., "Carbazole Compounds as Host Materials for Triplet Emitters in Organic Light-Emitting . . . ", JACS, 126, pp. 7718-7727 (2004).
Ma et al., "Bright electroluminescence from a new conjugated dendrimer", Synthetic Metals, 137, pp. 1125-1126 (2003).

* cited by examiner

ELECTRONIC DEVICES CONTAINING ORGANIC SEMI-CONDUCTORS

RELATED APPLICATIONS

This application is a national stage application (under 35 U.S.C. §371) of PCT/EP2005/010112 filed Sep. 20, 2005, which claims the benefit of European application 04023475.9 filed Oct. 1, 2004.

In a series of different types of applications which can be classed within the electronics industry in the widest sense, the use of organic semiconductors as functional materials has been reality for some time or is expected in the near future. For instance, organic charge transport materials (generally hole transporters based on triarylamines) have already found use for several years in copying machines. The development of organic transistors (O-TFTs, O-FETs), organic integrated circuits (O-ICs) and organic solar cells (O-SCs) is already at a very far advanced stage of research, so that introduction onto the market can be expected within the next few years. Organic electroluminescent devices (OLEDs) have already been introduced onto the market, as demonstrated, for example, by the car radios from Pioneer or a digital camera from Kodak with an organic display. In the case of the polymeric light-emitting diodes (PLEDs) too, the first products are available on the market in the form of a small display in a shaver and a mobile telephone from Philips N. V. The general structure of such PLEDs is reproduced in WO 90/13148. In spite of all advances, distinct improvements are still necessary to make these displays a real competitor to the currently market-leading liquid-crystal displays (LCDs) or to overtake them.

Especially the lifetime, but also the efficiency, of these devices is to date still insufficient, so that, while relatively simple devices as described above are already available as commercial products, it has to date not yet been possible to realize high-value long-lifetime devices, for example for laptops, televisions, etc. To improve these properties, optimizations have been undertaken in the last few years, both in the chemical structures of the materials used and in the device structure. This has already allowed distinct advances to be achieved. However, further improvements are still needed to be able to use these materials in high-value devices.

The significance of the material purity for organic electronic devices has already been mentioned in the literature:

For instance, EP 0895442 describes OLEDs in which not more than $10^{13}$ electron spins per mg of compound exist, since these function as traps for electrons and holes. These electron spins are suspected to stem, inter alia, from contaminations of the compounds and can be removed effectively, for example, by sublimation.

EP 1087448 states that the presence of ionic impurities from the first and second group of the Periodic Table of the Elements, in particular Na and K, leads to high current flow without recombination and light emission in the device, which unnecessarily generates heat which damages the device. Therefore, organic semiconductors are proposed there, whose content of the abovementioned ionic impurities is less than 0.1 ppm. To purify the materials, the methods customary for organic compounds, such as recrystallization, sublimation, dialysis, etc, are listed.

JP 2004/039566 describes how use of chelating agents can remove metallic impurities which have been used, for example, as catalysts in the synthesis from organic semiconductors. The use of complexing agents for this purpose is also described, for example, in WO 03/048225 and in WO 00/53656.

JP 2004/039567 describes how use of chelating agents can remove boron impurities which may be present as by-products of the synthesis from organic semiconductors. However, this method has the disadvantage that it can remove free boron impurities but not impurities (or incompletely reacted reactants) which are bound to the semiconductor and do not react with the chelating agent. As a result, the boron content cannot be lowered to a very low level.

JP 2003/347624 describes how use of supercritical solvents can lower the content of impurities in organic semiconductors down to between 0.01 and 50 ppm. Just as above, this method also has the disadvantage that it can only capture free impurities, but not impurities which are bonded covalently to the reaction by-products (or incompletely reacted reactants) of the organic semiconductor, for example unreacted functional groups, for example halogen substituents or boronic acid derivatives.

EP 1063869 describes OLEDs in which the organic components contain less than 500 ppm of impurities, in particular halogenated impurities. However, in-house experiments demonstrate that such a level of impurities is still more than one order of magnitude too high to achieve the desired effect. Thus, a content of halogenated impurities in the region of close to 500 ppm might perhaps achieve the first small effects, but the object of reproducibly obtaining long-lifetime organic electronic devices is not achieved in this way.

It becomes clear from these descriptions that, although the purity requirements and purifications mentioned were able to improve the properties of the materials, they were not yet capable of solving the above-described problems. In particular, it has been found that certain impurities specified more precisely below, even in very small contents, can distinctly disrupt the function of the electronic device, in particular the lifetime. Without wishing to be bound to a particularly theory, we suspect that these are not only free impurities, but also, in particular, impurities bonded to the organic semiconductor or semiconductor by-products, or else incompletely reacted reactants, in particular halogens, which can remain from the reaction. These covalently bonded impurities cannot be removed by the abovementioned methods. On the other hand, reactive halogens are very frequently involved in the synthesis of organic semiconductors or their precursors and are therefore also typically present as an impurity in different contents in the organic semiconductor. It is therefore an object of the present invention to offer a technical improvement therefor.

The invention provides electronic devices comprising at least one organic semiconductor, characterized in that the content of at least one of the halogens fluorine, chlorine, bromine and/or iodine in the organic semiconductor is less than 20 ppm.

Organic semiconductors are typically especially those in whose production a reactive bromine or else a reactive iodine or chlorine is involved in one of the following reactions in particular: Suzuki coupling, Stille coupling, Yamamoto coupling, Heck coupling, Hartwig-Buchwald coupling, Sonogashira coupling, Negishi coupling or Hiyama coupling. Organic semiconductors are also typically especially those in whose synthesis a reactive chlorine is involved in a Gilch reaction. This reactive halogen is eliminated during the reaction.

The invention therefore in particular provides electronic devices which comprise at least one organic semiconductor which has been obtained by a reaction in which a reactive halogen was involved, characterized in that the content of at least one of the halogens fluorine, chlorine, bromine and/or iodine in the organic semiconductor is less than 20 ppm. In particular, the content of the halogen which was involved in the reaction to synthesize the organic semiconductor is less than 20 ppm.

The electronic devices comprising at least one organic semiconductor are preferably selected from the group of electronic devices consisting of organic and polymeric light-emitting diodes (OLEDs, PLEDs), but also organic field-effect transistors (O-FETs), organic thin-film transistors (O-TFTs), organic integrated circuits (O-ICs), organic solar cells (O-SCs), organic field-quench devices (O-FQDs), organic light-emitting transistors (O-LETs), light-emitting electrochemical cells (LECs) or else organic laser diodes (O-Laser), to name just a few applications. Preference is given to electronic devices, characterized in that the content of bromine in the organic semiconductor is less than 20 ppm.

Preferences is further given to electronic devices, characterized in that all organic semiconductors in all layers contain less than 20 ppm of bromine.

Preference is further given to electronic devices, characterized in that the content of the halogens fluorine, chlorine, bromine and iodine in the organic semiconductor is in each case less than 20 ppm, with the proviso that this restriction applies to fluorine only when fluorine is not a constituent part of the chemical structure of the organic semiconductor, i.e. has not been incorporated for practical purposes into the structure of the organic semiconductor.

In the context of this application, organic semiconductors are low molecular weight, oligomeric, dendritic or polymeric, organic or organometallic compounds which, as a solid or as a layer, have semiconducting properties, i.e. in which the energy gap between conduction and valence bands is between 1.0 and 3.5 eV. The organic semiconductor used here is either a pure component or a mixture of two or more components, of which at least one has to have semiconducting properties. In the case of the use of mixtures, it is, however, not necessary that each of the components has semiconducting properties. For example, it is also possible to use electronically inert compounds, for example polystyrene, together with semiconducting compounds.

In a preferred embodiment of the invention, the organic semiconductor in the electronic device is polymeric. In the context of the present invention, polymeric organic semiconductors are in particular (i) the substituted poly-p-arylenevinylenes (PAVs) disclosed in EP 0443861, WO 94/20589, WO 98/27136, EP 1025183, WO 99/24526, WO 01/34722 and EP 0964045, (ii) the substituted polyfluorenes (PFs) disclosed in EP 0842208, WO 00/22027, WO 00/22026, DE 19981010, WO 00/46321, WO 99/54385 and WO 00/55927, (iii) the substituted poly-spiro-bifluorenes (PSFs) disclosed in EP 0707020, WO 96/17036, WO 97/20877, WO 97/31048, WO 97/39045 and WO 03/020790, (iv) the substituted poly-para-phenylenes (PPPs) or -biphenylenes disclosed in WO 92/18552, WO 95/07955, EP 0690086, EP 0699699 and WO 03/099901, (v) the substituted polydihydrophenanthrenes (PDHPs) disclosed in WO 05/014689, (vi) the substituted poly-trans-indenofluorenes and poly-cis-indenofluorenes (PIFs) disclosed in WO 04/041901 and WO 04/113412, (vii) the substituted polythiophenes (PTs) disclosed in EP 1028136 and WO 95/05937, (viii) the polypyridines (PPys) disclosed in T. Yamamoto et al., *J. Am. Chem. Soc.* 1994, 116, 4832, (ix) the polypyrroles disclosed in V. Gelling et al., *Polym. Prepr.* 2000, 41, 1770, (x) the substituted polyphenanthrenes disclosed in DE 102004020298.2, (xi) phosphorescent polymers, as described, for example, in DE 102004032527.8, (xii) the crosslinkable polymers described in WO 02/10129, (xiii) substituted soluble copolymers which have structural units from two or more of the classes (i) to (xii), as described, for example, in WO 02/077060, (xiv) the conjugated polymers disclosed in *Proc. of ICSM '98*, Part I & II (in: *Synth. Met* 1999, 101/102), (xv) substituted and unsubstituted polyvinylcarbazoles (PVKs), as disclosed, for example, in R. C. Penwell et al., *J. Polym. Sci., Macromol. Rev.* 1978, 13, 63-160, and (xvi) substituted and unsubstituted triarylamine polymers, as disclosed, for example, in JP 2000-072722.

In a further preferred embodiment of the invention, low molecular weight organic or organometallic semiconductors are used, a low molecular weight compound being understood to be a compound having a molecular weight of less than 10000 g/mol, preferably less than 5000 g/mol.

In a further preferred embodiment of the invention, dendritic organic or organometallic semiconductors are used. Examples of dendritic organic or organometallic semiconductors can be found in WO 99/21935, WO 01/059030 and WO 02/066552.

The content of at least one halogen, or the content of bromine, or in each case the content of fluorine provided that fluorine is not a constituent part of the chemical structure, chlorine, bromine and iodine, in the organic semiconductor is preferably less than 10 ppm, more preferably less than 5 ppm, even more preferably less than 1 ppm, in particular less than 0.1 ppm. This is the case especially when this corresponding halogen was involved in a preceding reaction step in the production of the organic semiconductor. It has been found that it is possible with such a low content of halogens to achieve particularly good results in the electronic devices. This relates in particular to the heavier halogens chlorine, bromine and iodine. Halogens, in particular bromine and iodine or else chlorine, are frequently present as an impurity in organic semiconductors when metal-catalyzed coupling reactions (for example Suzuki coupling, Yamamoto coupling, Hartwig-Buchwald coupling, etc) have been employed for the synthesis, as are widely used for the synthesis of organic semiconductors. Since these coupling reactions are also used to synthesize conjugated polymers, polymeric organic semiconductors also have these impurities. Chlorine is present as an impurity in particular after the synthesis of poly-para-phenylenevinylenes by the Gilch method, since this method starts from halomethyl-substituted, preferably chloromethyl-substituted, aromatics. These impurities may be present either in free form, for example as an anion or as halogen bonded to a low molecular weight structure with C—X bond, or bonded covalently to the organic semiconductor or its by-products or reactants. Especially covalently bonded halogens cannot be removed by simple purification processes, for example recrystallization, sublimation, reprecipitation, etc. It is thus barely possible by standard methods of the prior art to remove them to such an extent that the content of these impurities is sufficiently low to ensure good electronic properties.

It has also been found that the electronic properties, in particular the lifetime, but also efficiency, of the organic electronic device can be enhanced still further when, in addition to the low content of halogens, the content of other elements, which may be present as impurities or in by-products, in the organic semiconductor is below a certain content.

It is thus preferred when the content of sulphur in the organic semiconductor is less than 20 ppm, more preferably less than 10 ppm, even more preferably less than 5 ppm, in particular less than 1 ppm, provided that sulphur is not bonded into the organic semiconductor as a constituent part of the chemical structure, for example in thiophenes. Sulphur impurities can stem, for example, from the workup of the organic semiconductors when, for example, the metal is removed after a metal-catalyzed coupling reaction by extraction with thiocarbamate solution. Sulphur impurities can also stem from the synthesis when, for example, sulphonates have been used in a Suzuki coupling.

It is further preferred when the content of phosphorus in the organic semiconductor is less than 20 ppm, more preferably less than 10 ppm, even more preferably less than 5 ppm, in particular less than 1 ppm, provided that phosphorus is not bonded into the organic semiconductor as a constituent part of the chemical structure, for example in triarylphosphines. Phosphorus impurities may stem, for example, from the catalyst which is used for metal-catalyzed coupling reactions, for example from aliphatic or aromatic phosphine ligands, but also from phosphate-containing bases or buffer systems.

It is further preferred when the content of silicon in the organic semiconductor is less than 20 ppm, more preferably less than 10 ppm, even more preferably less than 5 ppm, in particular less than 1 ppm, provided that silicon is not bonded into the organic semiconductor as a constituent part of the chemical structure. Silicon impurities may stem, for example, from glass reaction vessels or tank enamellings, in which the reactions were carried out, and are leached out of the glass or enamel especially as a result of addition of fluoride and/or basic reaction conditions as are required for some coupling reactions (fluorosilicates). Silicon impurities may also stem from the synthesis when, for example, arylsilanes are used in an Hiyama coupling.

It is further preferred when the content of boron in the organic semiconductor is less than 20 ppm, more preferably less than 10 ppm, even more preferably less than 5 ppm, in particular less than 1 ppm, provided that boron is not bonded into the organic semiconductor as a constituent part of the chemical structure, for example in triarylboranes. Boron impurities may stem from the glass reaction vessel (borates) in which the reaction was carried out. However, they may also stem from the reaction itself when, for example, boronic acid derivatives are used in Suzuki coupling reactions. These may then be present either in free form as reaction by-products or bonded to the organic semiconductor as incompletely reacted reactants. It is further preferred when the content of tin and/or of zinc in the organic semiconductor is less than 20 ppm, more preferably less than 10 ppm, even more preferably less than 5 ppm, in particular less than 1 ppm. Tin or zinc impurities may stem from the reaction when, for example, tin or zinc derivatives are used in Stille or Negishi coupling reactions. These may then be present either in free form as reaction by-products or bonded to the organic semiconductor as incompletely reacted reactants.

The content of the abovementioned impurities may be determined by various analytical standard methods. Examples here include ICP-MS (inductively coupled plasma mass spectrometry), LA-ICP-MS (laser ablation inductively coupled plasma mass spectrometry), GDMS (glow discharge mass spectrometry), SIMS (secondary ion mass spectrometry), ICP-OES (inductively coupled plasma optical emission spectroscopy) and preferably neutron activation. An overview of the different mass spectrometry methods is given, for example, by J. S. Becker et al., *Internat. J. Mass Spectrometry* 2003, 228, 127-150. An overview of analysis by neutron activation is given, for example, by R. Zeisler et al., *Handbook of Nuclear Chemistry*, Ed. A. Vertes, 2003, 3, 303-362, Kluwer Academic Publishers, and S. Landsberger, *ACS Symposium* 2004, 868 (Radioanalytical Methods in Interdisciplinary Research), 307-336. These methods allow the content of the impurities mentioned to be determined very precisely and down to a content of 0.1 ppm and less, for many elements even into the ppb range. These methods are therefore particularly suitable for determining the content of impurities. The standard analytical methods for the characterization of chemical compounds in organic synthesis, for example NMR or HPLC, are unsuitable for determining such small contents of impurities.

The invention further provides for the use of organic semiconductors having a content of at least one of the halogens fluorine, chlorine, bromine or iodine, in particular bromine, of less than 20 ppm in an electronic device. Here too, the abovementioned preferences apply.

A further aspect of the present invention are organic semiconductors obtainable by a process comprising the following steps:

a) production of the organic semiconductor by means of a reaction with a reactive halogen, in particular Suzuki coupling, Stille coupling, Yamamoto coupling, Heck coupling, Hartwig-Buchwald coupling, Sonogashira coupling, Negishi coupling, Hiyama coupling or Gilch reaction;

b) optional isolation of the organic semiconductor from a);

c) aftertreatment of the organic semiconductor, such that the content of halogen, in particular bromine, in the organic semiconductor is reduced;

characterized in that the content of at least one of the halogens fluorine, chlorine, bromine or iodine, in particular bromine, is less than 20 ppm.

After step a), the halogen content, in particular the bromine content when reactive bromine was involved in the reaction, is typically distinctly higher than 20 ppm. The organic semiconductor can be aftertreated in situ directly after the last synthesis stage. However, it is preferred to isolate the organic semiconductor as a solid and to carry out the aftertreatment in a separate reaction step.

Suitable reagents for aftertreatment are those which react with organically bonded halogens, in particular with halogens bonded to aromatics.

Preference is given to reducing agents which reduce the halogen and exchange it for hydrogen.

Suitable for this purpose are in particular simple hydrides of the alkali metals or alkaline earth metals, for example NaH, MgH$_2$ or LiH, ternary hydrides containing boron or aluminium, for example LiAlH$_4$, NaAlH$_4$, LiBH$_4$, NaBH$_4$, NaB(CN)$_3$H, LiAlR$_3$H, LiAl(OR)$_3$H, NaBR$_3$H or NaB(OR)$_3$H where R is a C$_1$ to C$_6$ alkyl group, alanes, for example AlH$_3$ or R$_2$AlH where R is a C$_1$ to C$_6$ alkyl group, or boranes, for example B$_2$H$_6$, BH$_3$.THF or R$_2$BH where R is a C$_1$ to C$_6$ alkyl group. Also suitable are transition metal hydrides which, if anything, have the character of alloys of metals with hydrogen, in particular titanium hydride, hydrides of the titanium alloys with Cr, Mn or Ni, and also hydrogen-containing alloys containing magnesium and/or aluminium, which may also comprise further metals for activation. Also suitable for this purpose are complex transition metal hydrides, for example cyclopentadienyl metal hydrides, e.g. (Cp)$_2$TiH$_2$ or (Cp)$_2$MoH$_2$, or carbonyl metal hydrides, e.g. Mn(CO)$_5$H or Fe(CO)$_4$H$_2$. Preference is further given to main group element hydrides, for example silanes, alkylsilanes or halosilanes, e.g. SiH$_4$, Me$_3$SiH, H$_3$SiBr, etc, or stannanes, alkylstannanes or halostannanes, for example SnH$_4$, Bu$_3$SnH, Cl$_3$SnH, etc. All of these hydrides may optionally also be used in combination with a Lewis acid, for example AlCl$_3$ or ZnCl$_2$, to promote the reaction.

Preference is further given to homogeneous or heterogeneous transition metal catalysts, especially containing elements of the platinum group, in particular rhodium, iridium, palladium or platinum, which react together with elemental hydrogen, optionally under pressure, or a hydride source. An example here is Vaskas's complex ((PPh$_3$)$_2$Ir(CO)Cl) in combination with H$_2$.

Further hydride sources which may be used are organic compounds, for example hydroquinones, optionally in combination with a catalyst.

Preference is further given to organometallic reagents which enter into transmetallation and thus exchange the halogen for a metal atom, for example alkyl- or aryllithium reagents, alkyl or aryl Grignard reagents, or alkyl- or arylzinc reagents.

Preference is likewise given to reactive metals which exchange the halogen for a metal atom, for example alkali metals or alkaline earth metals, preferably Mg, Li or Na, but also alloys of alkali metals with one another or with other metals such as In or Ga, or else reactive transition metals, for example Zn. Preference is given to using these metals in finely divided form. The metalcontaining derivatives of the organic semiconductors which are obtained by transmetallation or reaction with reactive metals may be converted in a further step to the final compound. A useful reaction here is in particular the hydrolysis with a protic compound, for example with water or an alcohol, which results in the unsubstituted compound. A further example of a useful reaction is a metal-catalyzed coupling reaction with an aryl bromide or iodide, which forms an aryl-substituted compound (for example Negishi coupling). Yet a further preferred method for aftertreating halogenated organic semiconductors is the coupling with amines, aryl, vinyl or acetylene compounds, etc. under transition metal catalysis. Useful examples here are the reaction with a vinyl-H compound (Heck coupling), with an arylboronic acid derivative (Suzuki coupling), with an aryl-tin derivative (Stille coupling), with an aromatic amine (Hartwig-Buchwald coupling), with an acetylene-H compound (Sonogashira coupling) or with an arylsilane derivative (Hiyama coupling), in each case catalyzed by palladium. Likewise useful is the coupling with aryl halides, particularly bromides or iodides, with use of nickel compounds (Yamamoto coupling).

It is also possible to dehalogenate the halogenated organic semiconductors by means of appropriate suitable microorganisms, or to allow the appropriate halogenated compounds to be destroyed selectively by corresponding microorganisms while the unhalogenated organic semiconductor remains intact.

Analogously, to reduce the boron content, for example after a synthesis in which a Suzuki coupling was involved, the reaction with a low molecular weight aryl bromide under palladium catalysis is possible as a subsequent step. As a result, boronic acid groups remaining in the organic semiconductor are coupled with the aryl bromide and thus removed from the semiconductor. Since a low molecular weight aryl bromide is used here preferentially, this may be removed from the organic semiconductor after the aftertreatment by simple purification processes, for example by recrystallization, reprecipitation or simply washing, and does not remain in the product as a halogen impurity.

The aftertreatment may be carried out in organic solvents. However, it may also be carried out in liquefied or supercritical gases, for example in liquid NH$_3$ or SO$_2$, or in supercritical CO$_2$. These solvents offer the advantage that, after the solvent has been evaporated off, the prepurified product can be isolated in a simple manner.

A preferred after treatment reaction is a coupling reaction under transition metal catalysis, in particular palladium catalysis. Especially preferred is a Suzuki coupling, in which the reagent used is a low molecular weight boronic acid derivative. This is especially true of polymeric organic semiconductors, since a possible excess of low molecular weight boronic acid derivative in these can be removed after the reaction in a simple manner, for example by washing or reprecipitation.

A further preferred aftertreatment reaction is the reaction with metal organyls or reactive metals to form an organometallic intermediate of the organic semiconductor and subsequent hydrolysis. This is especially true when the organic semiconductor, apart from the halogen impurities, bears no reactive groups which can react with metal organyls or reactive metals. Preference is given to the reaction with organolithium compounds at low temperatures and with magnesium to form a Grignard reagent at elevated temperature, followed by hydrolysis with water or alcohols.

Especially metal-catalyzed coupling reactions are already used in the prior art for end-capping in the synthesis of semiconductive polymers. However, these end-cappers (=monofunctional compounds) are either added actually at the start of the synthesis or they are added to the reaction solution in situ on completion of the polymerization. Since a highly active catalyst system is no longer always present at this time, it cannot be assumed that the polymers then quantitatively bear the desired end groups; instead, functional reactive groups remain here in the polymer, in particular halogens and boronic acid derivatives. Therefore, even by a standard end-capping process as described in the literature (for example WO 04/009668), it is not possible reproducibly to lower the content of halogens in the organic semiconductor to a value of <20 ppm. Even in the case of low molecular weight compounds, especially when the last reaction step in the preparation of the organic semiconductor consists in a coupling reaction in which an aryl halide is involved, functional reactive groups remain in the compound, since organic reactions typically do not proceed quantitatively. The aftertreatment in a separate step (step c)) after isolation of the crude polymers or of the low molecular weight crude products allows this to be prevented, and the reaction can be carried out reproducibly.

A further suitable aftertreatment step for the reduction of the boron content is deboronation, for example with various acids (e.g. H. G. Kuivila et al., *J. Am. Chem. Soc.* 1960, 82, 2159-2163).

It may also be viable to repeatedly carry out the same or different aftertreatment steps (step c)) successively in order to even further lower the content of halogens and any other impurities.

The invention further provides solutions of one or more inventive organic semiconductors in one or more solvents. It is preferred when the content of the abovementioned impurities in the solvents is likewise below the abovementioned limiting values.

The inventive electronic devices comprising at least one organic semiconductor, whose content of bromine, or of halogens in general and, if appropriate, also of further impurities, as described above is below certain limiting values, have some crucial advantages:

1. The lifetime and the efficiency of the electronic devices are improved. This is essential for the development of long-lifetime and high-value electronic devices. These statements are amplified in Examples 3 to 5, 8 and 9.

2. A further advantage of the inventive electronic devices is the absence of the frequently observed "initial drops". This refers to a steep decline in the luminescence in the first few hours of the lifetime of an OLED or PLED before the further decline can be described by an approximately exponential curve. The cause of this initial drop was hitherto unknown and its irreproducible occurrence, even in the case of organic semiconductors or polymers of the same composition, was a problem. The absence of the initial drop thus allows organic electronic devices to be produced reproducibly.
3. The degree of conversion of organic reactions is not always entirely controllable and reproducible. Thus, small variations are normal. However, even very small variations, for example in the range from 99.8 to 99.9% conversion, can, especially in polymerization reactions, have an enormous difference in the number of end groups present in the polymer. These end groups in a Suzuki polymerization are halogens, in particular bromine, and boronic acid derivatives. The process according to the invention and the separate aftertreatment of the organic semiconductors allows these to be removed, which leads to better reproducibility of the overall polymerization process (or of the organic synthesis).

In the present application text and also in the examples which follow below, the aim is in particular on organic and polymeric light-emitting diodes and the corresponding displays. In spite of this restriction of the description, it is possible for those skilled in the art without any further inventive activity also to use corresponding organic semiconductors for the production of other devices, for example for organic field-effect transistors (O-FETs), organic thin-film transistors (O-TFTs), organic integrated circuits (O-ICs), organic solar cells (O-SCs), organic field-quench devices (O-FQDs), organic light-emitting transistors (O-LETs), light-emitting electrochemical cells (LECs) or else organic laser diodes (O-Laser), to name just a few applications.

The present invention is illustrated in detail by the examples which follow without any intention to restrict it thereto. From the description and the adduced examples, those skilled in the art can prepare further inventive electronic devices or employ the process according to the invention to prepare organic semiconductors without inventive activity.

EXAMPLES

Example 1

Aftertreatment of
1,6-bis(spiro-9,9'-bifluoren-2-yl)pyrene 1,6-bis(Spiro-9,9'-bifluoren-2-yl)pyrene was prepared according to standard methods by Suzuki coupling from spiro-9,9'-bifluorene-2-boronic acid and 1,6-dibromopyrene. 8.31 g (10 mmol) of 1,6-bis(spiro-9,9'-bifluoren-2-yl)pyrene having a purity greater than 99.9% by HPLC and a bromine content of 120 ppm (determined by neutron activation) were suspended in 100 ml of absolute THF. The pale yellow suspension was cooled to −78° C. and admixed dropwise with 10 ml (16 mmol) of a 1.6 M solution of tert-butyllithium in hexane, in the course of which the colour of the pale yellow suspension changed to deep green. The reaction mixture was stirred at −78° C. for a further 6 h. Subsequently, the reaction mixture was admixed with a mixture of 10 ml of methanol and 50 ml of THF. After warming to room temperature, the reaction mixture was freed of the solvent, and the residue was taken up in a mixture of 100 ml of ethanol and 100 ml of water, and stirred under reflux for 30 min. After cooling, the mixture was filtered off with suction from the solid. The solid was washed three times with 50 ml each time of a mixture of ethanol and water (1:1, v:v) and three times with 50 ml each time of ethanol. After drying, the pale yellow solid was recrystallized twice more from NMP and sublimed under high vacuum (p=2×10$^{-5}$ mbar, T=420° C.). The purity was greater than 99.9% by HPLC at a bromine content of 8 ppm (determined by neutron activation).

Example 2

OLED Comprising Aftertreated
1,6-bis(spiro-9,9'-bifluorene-2-yl)pyrene

The OLEDs were produced by a general process according to WO 04/058911. For better comparability, the basic structure, the materials and layer thicknesses used, apart from those of the emitting layer and the electron transport layer, were identical. The compound H1 (from Example 1, bromine content 8 ppm) was used in the emission layer, either as pure layer or as a host material together with a dopant. In comparison, the same compound which had not been separately aftertreated and whose bromine content was 120 ppm was also used.

Analogously to the abovementioned general process, OLEDs having the following structure were produced:

Hole injection layer (HIL) 80 nm of PEDOT (spin-coated from water; purchased from H. C. Starck, Goslar, Germany; poly(3,4-ethylenedioxy-2,5-thiophene))

Hole transport layer (HTM) 20 nm of NaphDATA (applied by vapour deposition; purchased from SynTec, Wolfen, Germany; 4,4',4"-tris(N-1-naphthyl-N-phenylamino) triphenylamine)

Hole transport layer (HTM) 20 nm of S-TAD (applied by vapour deposition; prepared according to WO 99/12888; 2,2',7,7'-tetrakis(diphenylamino)-spiro-9,9'-bifluorene)

Emission layer (EML) See Table 1 for materials, concentration and layer thicknesses Electron conductor (ETL) 20 nm of AlQ$_3$ (applied by vapour deposition; purchased from SynTec, tris(quinolinato)aluminium(III); not used in all cases)

Ba—Al (cathode) 3 nm of Ba, 150 nm of Al thereon.

These OLEDs were characterized in a standard manner; for this purpose, the electroluminescence spectra, the efficiency (measured in cd/A), the operating voltage and the lifetime were determined. The lifetime is defined as the time after which the initial brightness of the OLED has fallen by half at a constant current density of 10 mA/cm$^2$.

Table 1 summarizes the results of some OLEDs (Examples 3 to 5), the composition of the EML including the layer thickness also being listed in each case. As emitting materials, the EMLs comprise either pure 1,6-bis(spiro-9,9'-bifluoren-2-yl)pyrene (host H1) or the dopant D1 (synthesized according to DE 102004031000.9) doped into 1,6-bis(spiro-9,9'-bifluoren-2-yl)pyrene (host H1). The comparative examples used are OLEDs which comprise 1,6-bis(spiro-9,9'-bifluoren-2-yl)pyrene which has not been aftertreated in the emitting layer, according to the prior art.

For better clarity, the appropriate structural formulae of 1,6-bis(spiro-9,9'-bifluoren-2-yl)pyrene (host H1 from Example 1) and of the dopant D1 as shown below:

TABLE 1

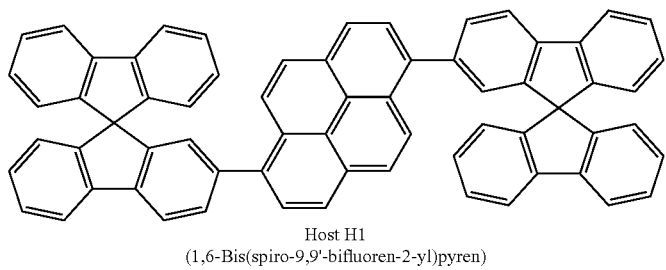

Host H1
(1,6-Bis(spiro-9,9'-bifluoren-2-yl)pyren)

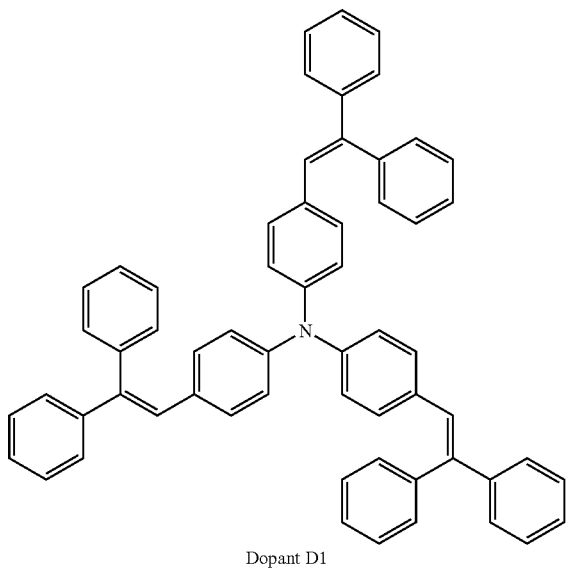

Dopant D1

| Example | EML | ETL | Max. efficiency [cd/A] | Voltage [V] at 100 cd/m$^2$ | CIE x, y | Lifetime [h] |
| --- | --- | --- | --- | --- | --- | --- |
| Example 3a (aftertreated) | H1 (30 nm) | AlQ$_3$ (20 nm) | 3.7 | 5.3 | x = 0.17; y = 0.22 | 1900 |
| Example 3b (comparative) | H1 (30 nm) | AlQ$_3$ (20 nm) | 3.7 | 5.4 | x = 0.17; y = 0.22 | 1400 |
| Example 4a (aftertreated) | H1 (40 nm) | | 3.4 | 5.6 | x = 0.16; y = 0.18 | 700 |
| Example 4b (comparative) | H1 (40 nm) | | 3.5 | 5.7 | x = 0.16; y = 0.18 | 450 |
| Example 5a (aftertreated) | H1:D1 (5%) (30 nm) | AlQ$_3$ (20 nm) | 5.6 | 5.4 | x = 0.17; y = 0.31 | 7500 |
| Example 5b (comparative) | H1:D1 (5%) (30 nm) | AlQ$_3$ (20 nm) | 5.5 | 5.5 | x = 0.17; y = 0.31 | 5400 |

Example 6

Aftertreatment of Polymer P1

Polymer P1 was synthesized according to standard methods by Suzuki coupling (WO 03/048225) from 50 mol % of M1, 30 mol % of M2, 10 mol % of M3 and 10 mol % of M4 with addition of 0.8 mol % of the end-capper E1.

5.05 g (8 mmol) of P1 with a molecular weight of $M_w$=280 000 g/mol (by GPC against polystyrene standard) and a bromine content of 775 ppm (determined by neutron activation) were dissolved in 80 ml of 1:1 toluene/dioxane. The fully dissolved polymer was admixed with end-capper E2 and with a solution of 4.05 g of potassium phosphate hydrate in 40 ml of H$_2$O, and carefully degassed. Subsequently, the catalyst (0.2% Pd(OAc)$_2$ and 1.2% P(o-tol)$_3$) was added and the reaction mixture was heated under reflux for 4 h. The solution was cooled to 60° C. and admixed with 40 ml of a 10% sodium thiocarbamate solution. The thus obtained mixture was stirred at 60° C. for a further 3 h. The solution was cooled to room temperature, the phases were separated and the organic phase was washed three times with H$_2$O. The polymer was isolated by precipitation from methanol and purified by reprecipitating twice from THF/methanol. The bromine content of the aftertreated polymer was 15 ppm (determined by neutron activation).

Analogously, further polymers were synthesized and aftertreated analogously to the method above. The composition of the polymers is specified in Table 2. For the sake of clarity, the monomers used are depicted below:

TABLE 2
Compositions of the polymers
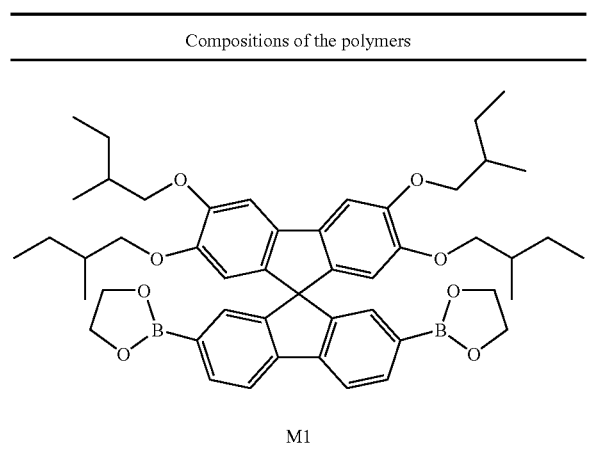
M1
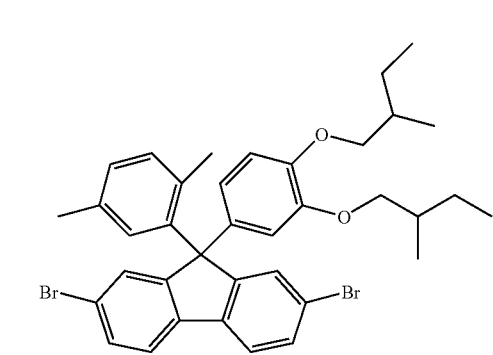
M2
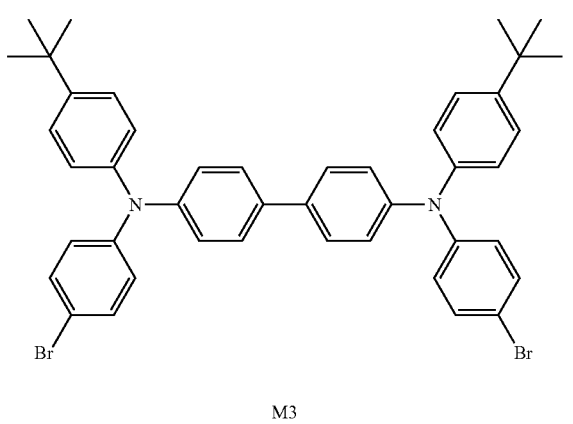 [SMILES: CC(C)(C)c1ccc(N(c2ccc(Br)cc2)c2ccc(-c3ccc(N(c4ccc(Br)cc4)c4ccc(C(C)(C)C)cc4)cc3)cc2)cc1]
M3
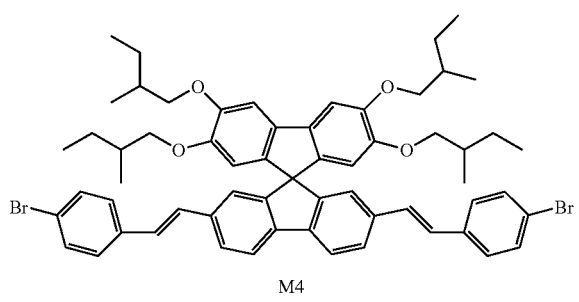 [SMILES: CCC(C)COc1cc2c(cc1OCC(C)CC)C1(c3cc(/C=C/c4ccc(Br)cc4)ccc3-c3ccc(/C=C/c4ccc(Br)cc4)cc31)c1cc(OCC(C)CC)c(OCC(C)CC)cc1-2]
M4
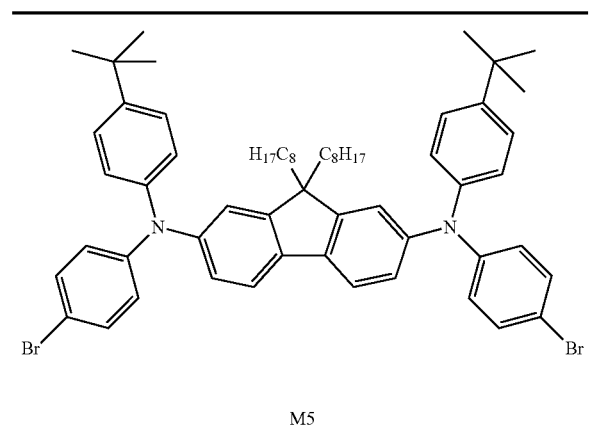
M5
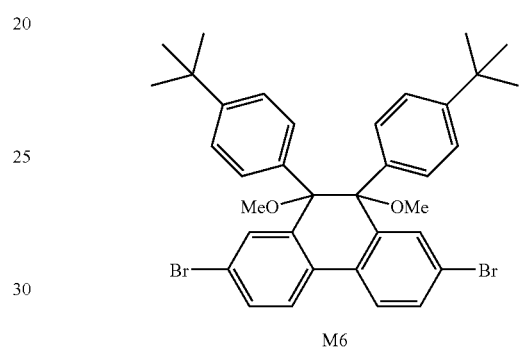
M6
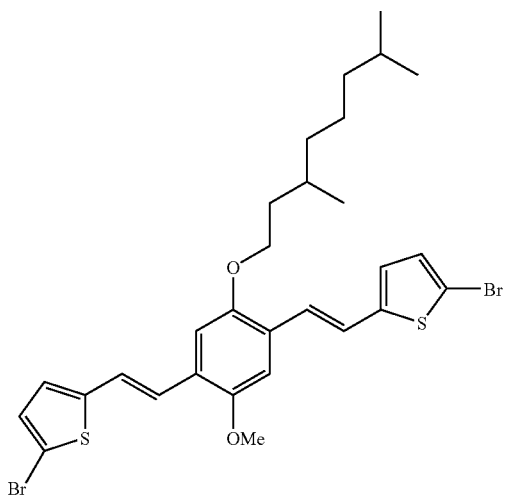
M7
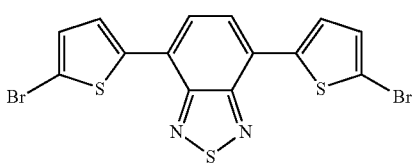
M8

TABLE 2-continued

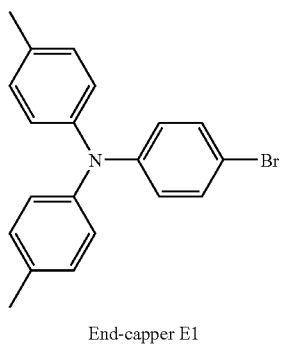 [SMILES: Cc1ccc(N(c2ccc(C)cc2)c2ccc(Br)cc2)cc1]

End-capper E1

TABLE 2-continued

End-capper E2

| | M1 | M2 | M3 | M4 | M5 | M6 | M7 | M8 |
|---|---|---|---|---|---|---|---|---|
| P1 | 50 | 30 | 10 | 10 | | | | |
| P2 | 50 | 30 | 10 | 10 | | | | |
| P3 | 50 | 39.88 | | | 10 | | 0.1 | 0.02 |
| P4 | 50 | | | | 10 | 40 | | |

Example 7

Production of the PLEDs

The polymers were investigated for use in PLEDs. The PLEDs were each two-layer systems, i.e. substrate//ITO//PEDOT//polymer//cathode. PEDOT is a polythiophene derivative (Baytron P, from H. C. Stack, Goslar). The layer thickness of the PEDOT layer and of the polymer layer was in each case 80 nm. The cathode used in all cases was Ba/Ag (Aldrich). How PLEDs can be prepared is described in detail in WO 04/037887 and the literature cited therein.

Example 8

Device Results with Polymers P1 to P4

The results which were obtained in PLEDs when polymers P1 to P4 which had been aftertreated according to the abovementioned method were used are summarized in Table 3. Likewise listed are the electroluminescence results which were obtained using the polymers which had not been aftertreated.

As can be seen clearly, the inventive polymers which have a lower bromine content are distinctly better in the electroluminescence than polymers having a higher bromine content according to the prior art, especially in the lifetime, but also in the efficiency.

TABLE 3

Device examples with polymers P1 to P4

| | Before the aftertreatment | | | | After the aftertreatment | | | |
|---|---|---|---|---|---|---|---|---|
| Polymer | Bromine content [ppm] | Max. eff. [cd/A] | Lifetime [h] | U@ 100 cd/m² [V] | Bromine content [ppm] | Max. eff. [cd/A] | Lifetime [h] | U@ 100 cd/m² [V] |
| P1 | 775 | 4.60 | 16 | 4.03 | 14.2 | 3.80 | 1200 | 3.88 |
| P2 | 282 | 3.90 | 264 | 3.42 | 10.9 | 4.61 | 2300 | 3.43 |
| P3 | 20.5 | 2.90 | 590 | 4.54 | 2.63 | 3.27 | 900 | 4.55 |
| P4 | 413 | 5.56 | 1620 | 4.95 | 14.7 | 5.79 | 3100 | 4.90 |

Example 9

Results in the Case of Repeated Aftertreatment

Polymer P4 was treated a further three times with end-capper E2 analogously to Example 6. After each aftertreatment, the bromine content was determined and the polymers were tested in a PLED after each aftertreatment. The results which were obtained with this polymer are compiled in Table 4. It can be seen that each aftertreatment step results in the bromine content in the polymer falling further and finally being at value of less than 0.1 ppm. In parallel, the efficiency and in particular the lifetime rise significantly.

TABLE 4

Results with repeatedly aftertreated polymer P4

| | Untreated | 1st treatment | 2nd treatment | 3rd treatment | 4th treatment |
|---|---|---|---|---|---|
| Br content | 413 ppm | 14.7 ppm | 2.1 ppm | 0.3 ppm | <0.1 ppm |
| Max. eff. | 5.56 cd/A | 5.79 cd/A | 5.84 cd/A | 5.84 cd/A | 5.86 cd/A |
| Lifetime | 1620 h | 3100 h | 4200 h | 5700 h | >6000 h |
| U | 4.95 V | 4.90 V | 4.88 V | 4.86 V | 4.86 V |

The invention claimed is:
1. An electronic device comprising at least one organic semiconductor with less than 20 ppm of each of fluorine, chlorine, bromine, and iodine, with the proviso that this restriction applies to fluorine only when fluorine is not a constituent part of the chemical structure of the organic semiconductor, and having an energy gap between conduction and valence bands between 1.0 eV and 3.5 eV, wherein said elec- tronic device is selected from the group consisting of organic or polymeric light-emitting diodes and light-emitting electrochemical cells.

2. The electronic device of claim 1, wherein the at least one organic semiconductor is a low molecular weight polymeric compound.

3. The electronic device of claim 1, wherein the at least one organic semiconductor is a low molecular weight dentritic compound.

4. The electronic device of claim 1, wherein the at least one organic semiconductor has less than 5 ppm of bromine.

5. The electronic device of claim 1, wherein the at least one organic semiconductor comprises polyfluroene, poly-spiro-bifluorine, biphenylene, or polythiophene.

6. The electronic device of claim 1, wherein said at least one organic semiconductor is organometallic.

7. The electronic device of claim 1, wherein said at least one organic semiconductor has a sulphur content of less than 20 ppm.

8. The electronic device of claim 1, wherein said at least one organic semiconductor has a phosphorus content of less than 20 ppm.

9. The electronic device of claim 1, wherein said at least one organic semiconductor has a silicon content of less than 20 ppm.

10. The electronic device of claim 1, wherein said at least one organic semiconductor has a boron content of less than 20 ppm.

11. The electronic device of claim 1, wherein the at least one organic semiconductor has less than 10 ppm of each of fluorine, chlorine, bromine, and iodine.

12. The electronic device of claim 11, wherein the at least one organic semiconductor comprises polyfluroene, poly-spiro-bifluorine, biphenylene, or polythiophene.

13. The electronic device of claim 11, wherein the at least one organic semiconductor has less than 5 ppm of bromine.

14. The electronic device of claim 13, wherein the at least one organic semiconductor comprises polyfluroene, poly-spiro-bifluorine, biphenylene, or polythiophene.

* * * * *